US006787242B2

(12) United States Patent
Atzesdorfer et al.

(10) Patent No.: US 6,787,242 B2
(45) Date of Patent: Sep. 7, 2004

(54) METHODS OF USING ADHESION ENHANCING LAYERS AND MICROELECTRONIC INTEGRATED MODULES INCLUDING ADHESION ENHANCING LAYERS

(75) Inventors: Alexandra Atzesdorfer, Weil am Rhein (DE); Rainer Müller, Schrobenhausen (DE); Klaus Heckmann, Pettendorf (DE); Friederike Bauer, Regensburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/454,522

(22) Filed: Jun. 4, 2003

(65) Prior Publication Data

US 2003/0207114 A1 Nov. 6, 2003

Related U.S. Application Data

(62) Division of application No. 09/599,273, filed on Jun. 22, 2000, now abandoned, which is a continuation of application No. PCT/EP98/08209, filed on Dec. 15, 1998, now abandoned.

(30) Foreign Application Priority Data

Dec. 22, 1997 (DE) .......................................... 197 57 302

(51) Int. Cl.[7] .............................................. B32B 15/04
(52) U.S. Cl. ....................... 428/457; 428/463; 428/343; 548/455; 558/46; 558/60; 560/154; 564/500; 568/22; 568/24
(58) Field of Search ................................. 428/457, 463, 428/343; 548/455; 558/46, 60; 560/154; 564/500; 568/22, 24

(56) References Cited

U.S. PATENT DOCUMENTS

| 2,371,207 | A | 3/1945 | Zublin et al. |
| 3,876,371 | A | 4/1975 | Costain et al. |
| 5,108,573 | A | 4/1992 | Rubinstein et al. |

(List continued on next page.)

FOREIGN PATENT DOCUMENTS

| DE | 2 342 256 | 2/1974 |
| DE | 43 33 127 A1 | 3/1995 |
| EP | 0 529 373 A1 | 3/1993 |

(List continued on next page.)

OTHER PUBLICATIONS

Müller, Eugen (ed): "Methoden Der Organischen Chemie" [Methods of Organic Chemistry], vol. VIII, 1952, Georg Thieme Verlag, Stuttgart, Germany, pp. 655–658.
McKay, A. F. et al.: "Reaction of Amino Alcohols with Carbon Disulphide", Can. J. Chem., vol. 36, 1958, pp. 147–150.

(List continued on next page.)

*Primary Examiner*—Leszek B Kiliman
(74) *Attorney, Agent, or Firm*—Laurence A. Greenberg; Werner H. Stemer; Gregory L. Mayback (57) ABSTRACT

Adhesion promoters for polymer coatings on metals are articulated into at least two head groups connected by a hydrocarbon spacer group. One head group reacts particularly well with polymer molecules. Other head groups form a durable bond with a metal surface. The length of the spacer group is such that a substance deposited in a substance layer on a metallic surface of a body or particle has hydrophobic properties. Suitable adhesion promoters can be sulfur compounds, amino compounds, hydroxyl or carbonyl compounds. A plastic composite body, a compound and a process of preparing a compound are also provided.

20 Claims, 3 Drawing Sheets

U.S. PATENT DOCUMENTS

| | | | |
|---|---|---|---|
| 5,347,015 A | | 9/1994 | Keller et al. |
| 5,969,414 A | * | 10/1999 | Parthasarathi et al. ...... 257/675 |
| 6,187,385 B1 | * | 2/2001 | Atkins ..................... 427/388.5 |

FOREIGN PATENT DOCUMENTS

| | | |
|---|---|---|
| EP | 0 592 972 A2 | 4/1994 |
| EP | 0 598 361 A1 | 5/1994 |
| FR | 2 236 018 | 1/1975 |
| FR | 2 747 685 A1 | 10/1997 |
| GB | 1038176 | 8/1966 |
| GB | 2 299 057 A | 9/1996 |
| JP | 57 198 269 | 12/1982 |
| JP | 01 159 386 | 6/1989 |
| WO | WO 90/05303 | 5/1990 |
| WO | WO 99/32688 | 7/1999 |

OTHER PUBLICATIONS

Shirai, Hirofusa et al.: "Functional Metal–Porphyrazine Derivatives and their Polymers, $4^{a)}$", Makromol. Chem., vol. 181, 1980, pp. 575–584.

Xue, Gi et al.: "Surface Reaction of 2–Mercaptobenzimidazole on Metals and its application in Adhesion Promotion", Journal of the Chemical Society Faraday Transactions, vol. 87, Apr 21, 1991, No. 8, pp. 1229–1232.

Häußling, Lukas et al.: "Rastertunnelmikroskopische Beobachtung von spezifisch adsorbiertem Streptavidin auf Biotin–funktionalisierten, selbstorganisierten Monoschichten" [Grid–Tunnel Microscopical Surveillance of Specific Adsorbed Streptavidin on Biotin Functionalized Self–Organized Mono Layers], Angew. Chem., vol. 103, 1991, No. 5, pp. 568–572.

Yamamoto, Yuichi et al.: "Self–Assembled Layers of Alkanethiols on Copper for Protection Against Corrosion", Journal of the Electrochemical Society, vol. 140, 1993, No. 2, pp. 436–443.

Gu, X.H. et al.: "Effect of Deposition for γ–Aminopropyltriethoxy Silane on Adhesion between Copper and Epoxy Resins", Applied Surface Science vol. 115, 1997, pp. 66–73.

* cited by examiner-

Copper [29H, 31H-phthalocyanine-2, 9 or 10, 16 or 17, 23 or 24-tetracarbonyl tetra(ω-hydroxyalkyl)amide] with n = 3, 6 and 11

FIG 3

FIG 4  11-Mercaptoundecanol

FIG 5  Bis-(16-hexadecansäure)-disulfid

METHODS OF USING ADHESION ENHANCING LAYERS AND MICROELECTRONIC INTEGRATED MODULES INCLUDING ADHESION ENHANCING LAYERS

CROSS-REFERENCE TO RELATED APPLICATION

This is a division of U.S. application Ser. No. 09/599,273, filed Jun. 22, 2000, now abandoned which was a continuation of International application PCT/EP98/08209, filed Dec. 15, 1998, which designated the United States, which was not published in English, and which is now abandoned.

BACKGROUND OF THE INVENTION

Field of the Invention

The invention relates to an adhesion promoter for coatings on metals, a plastic composite body, a compound and a process of preparing a compound, in particular for microelectronics, which are used for improving the adhesion between metal surfaces and polymers, such as thermosets, deposited thereon and for solving the problem of oxidation of surfaces of metallic bodies or particles.

In particular, in the production of microchips encapsulated with casings, poor adhesion between metal surfaces and polymers frequently causes the problem of premature damage to the microchip. The reason therefor is primarily the difference in the coefficients of thermal expansion of the polymer used for the encapsulation and of the encapsulated metal. On exposure to heat, microcracks often form at the interface between polymer and metal, and can result in failure on further stressing, for example by moisture.

In a failure attributed to an effect known as the "popcorn" effect, water has diffused through the casing to the metal lead frame of the chip, where it accumulates at an interface. On warming of the integrated unit, for example during a soldering operation, the water present at the boundary layer expands, which can result in bursting of the casing.

A further problem is that not all metals used in chip manufacture can be encapsulated with the available polymers. Even fundamental adhesion problems occur in the case of some material combinations.

In order to improve the adhesion between polymers and metals, the prior art discloses using an adhesion promoter or a primer system. Those primers are admixed with the molding composition used to produce the casing. In spite of the slightly improved adhesion, the popcorn effect occurs in the case of those casings.

International Patent Publication WO 90/05303, corresponding to U.S. Pat. Nos. 5,436,161 and 5,242,828, shows the protection of a metallic surface against corrosion using a unimolecular layer of an organic molecule which contains, inter alia, disulfide.

German Published, Non-Prosecuted Patent Application DE 43 33 127 A1 discloses a process for the protection of solderable copper and copper alloy surfaces against corrosion using sulfur compounds.

European Patent Application 0 598 361 A1, corresponding to U.S. Pat. No. 5,455,072, shows a process for the production of a thin diamond film on the surface of a substrate using a unimolecular layer containing monomers. Silanes or thiols are employed for this purpose.

The use of 11-mercapto-1-undecanol for corrosion protection is reported in a paper in the Journal of the Electrochemical Society Vol. 140, No. 2, Feb. 1, 1993, pages 436–443, entitled "Self-Assembled Layers of Alkanethiols on copper for protection against corrosion" by Gi Xue et al. Use of 11-mercapto-1-undecanol as adhesion promoter between a metal and a polymer is not disclosed therein.

UK Patent Application GB 2 299 057 A, corresponding to U.S. Pat. No. 5,598,193, illustrates the treatment of a nozzle plate for inkjet pens with substances which form unimolecular layers. Use of the substances as adhesion promoter between a metal and a polymer is not disclosed therein.

U.S. Pat. No. 3,876,371 shows corrosion protection of steel by using, in particular, phthalocyanines. Use of these substances as adhesion promoter between a metal and a polymer is not disclosed therein.

U.S. Pat. No. 2,371,207 shows corrosion protection of steel by using, for example, sulfur-containing sub-stances having hydrocarbon chains. Use of the substances as adhesion promoter between a metal and a polymer is not disclosed therein.

European Patent Application 0 592 972 A shows metal and semiconductor substrates coated with a resist which can be used in X-ray lithography. A unimolecular adhesion promoter layer of silanes is provided between substrate and resist.

U.S. Pat. No. 5,108,573 illustrates a metallic surface of an electrode which is provided with an electrically conductive polymer film. The polymer film is in the form of a unimolecular layer containing a thiol.

French Patent Application 2 747 685 A1 illustrates a metallic surface of a substrate to which a unimolecular layer containing a silane has been applied. Use of the unimolecular layer as adhesion promoter between a metal and a polymer is not disclosed therein.

UK Patent 1,038,176 shows a razor blade to which a unimolecular layer of stearic acid has been applied. Use of the unimolecular layer as adhesion promoter between a metal and a polymer is not disclosed therein.

German Published, Non-Prosecuted Patent Application 2 342 256 A1, corresponding to U.S. Pat. No. 4,093,780, illustrates the use of thio-glycolates for protection of the surface of zinc against corrosion. Use as adhesion promoter between a metal and a polymer is not disclosed therein.

European Patent Application 0 529 373 A1, corresponding to U.S. Pat. No. 5,347,015, discloses disulfides which are suitable for producing monomolecular and multimolecular layers on precious metal substartes. A use thereof for adhesion improvement is not disclosed.

A paper entitled "Surface Reaction of 2-Mercaptobenimidole on Metals and its Application in Adhesion Promotion", by Gi Xue, et al. in the Journal of the Electrochemical Society, Vol. 140, No. 2, Feb. 1, 1993, pages 436–443, discloses the use of a 2-mercaptobenzimidazole for adhesion improvement of an epoxy resin of metal. That substance, however, does not have a spacer group in the sense of the invention so that a hydrophobic layer is not created on the coated metal. The known "popcorn effect" is not avoided therewith.

Patent Abstracts of Japan, Publication No. 01159386 illustrates the use of a derivative of 3-Aminopropylsiloxane for forming a corrosion-preventing monomolecular layer on a surface of a heat exchanger made of copper.

Patent Abstracts of Japan, Publication No. 57198269 describes mercaptanes for corrosion-preventing coating of iron plates which are coated with silver.

According to X. H. Gu et al. in "Applied Surface Science" 115, 66 (1997), 3-aminopropyltriethoxysilane is employed as an adhesion promoter for copper and epoxy resin. The dry adhesion of the epoxy resin to copper is increased upon use of that substance. Nevertheless, adhesion problems occur under stress conditions, in particular after moisture weathering and under the influence of high temperatures.

Finally, it is known that metallic bodies or particles are frequently exposed to corrosion which prevents their processing, for example in a metallic ceramic. In the case of metallic bodies, oxidation of the surface is additionally undesired.

SUMMARY OF THE INVENTION

It is accordingly an object of the invention to provide an adhesion promoter for coatings on metals, a plastic composite body, a compound, a process of preparing a compound, in particular for micro-electronics, a method of using adhesion enhancing layers, and microelectronic integrated modules including adhesion enhancing layers that overcome the hereinafore-mentioned disadvantages of the heretofore-known materials and processes of this general type. More specifically, it is an object of the invention to provide substances with which the adhesion of polymers to substances such as metals, for example copper, is improved, even under unfavorable conditions. A further object is to provide substances with which the corrosion of the surfaces of particles and bodies can be prevented or reduced. The invention also has the object of indicating the advantageous use of substances which are already known. A further object is to provide processes for the preparation of such substances. An additional object of the invention is to provide, in particular, correspondingly improved plastic composite articles.

With the foregoing and other objects in view there is provided, in accordance with the invention, an adhesion promoter for a polymer encasing deposited on a surface of a metal body, comprising a monofunctional, bifunctional, or polyfunctional compound having a molecule articulated into at least one first head group and at least one second head group connected to one another by a hydrocarbon spacer group, such that the first head group is reactive with the polymer and the second head group bonds to the surface of the metal, and the spacer group has a number of carbon atoms such that a layer of the polymer including the adhesion promoter deposited on a substance manifests hydrophobic properties.

The first and second head groups can be the same or different. The head groups can be amino groups, carboxamido groups, carboxyl groups, disulfide groups, hydroxyl groups, mercapto groups, metal phthalocyanin groups, and urea groups. The spacer group has from 3 to about 100 carbon atoms, preferably from 6 to 36 carbon atoms.

In accordance with the invention, the monofunctional, bifunctional, or polyfunctional compound adhesion promoter can be a sulfur compound, in particular a bifunctional thioalcohol in which the first head group is a mercapto group and the second head group is a hydroxyl group, such as 11-mercaptoundecanol; and/or a bifunctional disulfide in which the first head group is a disulfide group and a second head group is a hydroxyl group, such as 16,16'-dithiobis (hexadecanoic acid) and 11,11'-dithiobis(undecanol).

In accordance with the invention, the monofunctional, bifunctional, or polyfunctional compound adhesion promoter can be a nitrogen or amino compound, in particular a bifunctional ethylenediamine with a hydrophobic hydrocarbon chain, in which a first head group is an amino group and a second head group is a hydroxyl group, such as the novel compound N,N'-bis(11-hydroxyundecyl)ethylenediamine, and/or a bifunctional copper phthalocyanin with a hydrophobic hydrocarbon chain, such as the novel compounds copper-[29H,31H-phthalocyanin-2 9 or 10, 16 or 17, 23 or 24-tetracarbonyltetrachloride] amidated with an ω-hydroxyalkylamine having 3 to 11 carbon atoms.

In accordance with the invention, the monofunctional, bifunctional, or polyfunctional compound adhesion promoter can be a carbonyl compound, in particular a bifunctional urea with a hydrophobic hydrocarbon chain, such as the novel compound N,N'-bis(11-hydroxyundecyl)urea.

With the above object and other objects in view, there is also provided, in accordance with the invention, a plastic composite body, comprising a base body of metallic material, an encasing of polymer material, in particular of thermosetting material, and a layer in a region between the base body and encasing comprising at least one adhesion promoter selected from the group consisting of a bifunctional thioalcohol having a hydro-phobic hydrocarbon chain, in particular 11-mercapto-undecanol; a bifunctional disulfide having a hydrophobic hydrocarbon chain, in particular bis(16-hexadecanoic acid) disulfide; a bifunctional ethylenediamine having a hydrophobic hydrocarbon chain such as bis(ω-hydroxyundecane)-ethylene-diamine; a phthalocyanine, such as a bifunctional copper phthalocyanine having a hydrophobic hydrocarbon chain, in particular copper [29H,31H-phthalocyanine-2, 9 or 10, 16 or 17, 23 or 24-tetracarbonyl tetrachloride] which has been amidated with an ω-hydroxyalkylamine having 3 to 11 carbon atoms; and a bifunctional urea having a hydrophobic chain part, in particular N,N'-(bis-11-hydroxy-undecyl)-urea.

The base metal can be copper, silver, and gold. The polymer can be epoxy resin, polyurethane, silicone resin, acrylic resin, pheinoplast, urea-formaldehyde and melamine-formaldehyde, and alloys and copolymers thereof. Epoxy resin is preferred.

In particular, the plastic composite body can be of thermosetting material such that on study of the surface of a fracture surface produced, in particular, by means of a shear experiment, in a region between the base body and coating using an electron or X-ray spectroscopic method, a characteristic distribution of chemical elements arises which indicates the presence of an essentially uni-molecular layer containing at least one adhesion promoter selected from the group consisting of a bifunctional thioalcohol having a hydrophobic hydrocarbon chain, in particular 11-mercapto-undecanol; a bifunctional disulfide having a hydrophobic hydrocarbon chain, in particular bis(16-hexadecanoic acid) disulfide; a bifunctional ethylenediamine having a hydrophobic hydrocarbon chain such as bis(ω-hydroxyundecane)-ethylene-diamine; a phthalocyanine, such as a bifunctional copper phthalocyanine having a hydrophobic hydrocarbon chain, in particular copper [29H,31H-phthalocyanine-2, 9 or 10, 16 or 17, 23 or 24-tetracarbonyl tetrachloride] which has been amidated with an ω-hydroxyalkylamine having 3 to 11 carbon atoms; and a bifunctional urea having a hydrophobic chain part, in particular N,N'-(bis-11-hydroxy-undecyl)-urea.

The invention is based on the basic concept of using a substance in which in each case one molecule is divided into at least one first head group and optionally into at least one second head group that are connected to one another by a spacer group.

Through this functional articulation of the adhesion promoter according to the invention into the head groups and the spacer group, influence can be brought to bear particularly well on the requirements of polymers and substances such as metals to be bonded to one another or of corrosion protection, in particular of metallic bodies and particles.

For the case where two head groups are present, it can be ensured through the choice of the suitable first head group that the head group reacts particularly reactively with polymer molecules, as used for polymers serving for encapsulation of substances such as metals. The other head group can be designed in such a way that it forms a durable bond with a surface of a substance, which is also particularly advantageous if a metallic surface of a particle or of a body is to be coated with the substance according to the invention. In implementing the invention, it has been observed that 3-aminopropyltriethoxysilane, which is known from the prior art, can be employed, in accordance with the teaching of the invention, as adhesion promoter between glass and epoxy resin; but not between metal and epoxy resin.

Through a suitable assignment of the length of the spacer group, for example of a hydro-carbon chain, it can be ensured that the substance deposited in a substance layer on a substance surface has hydrophobic properties.

In accordance with the basic idea of the invention, the length of the spacer determines the flexibility and/or the water permeability of the layer. This allows a moisture barrier and thus corrosion protection to be achieved by the substance layer. In addition, the provision of a hydro-phobic layer prevents local accumulation of water mole-cules, thus effectively preventing the popcorn effect.

Preference is given to a substance which can be deposited in an essentially unimolecular substance layer on an, in particular, metallic substance surface. A substance of this type can be deposited on a metallic surface by chemisorption, where the substance, prefer-ably dissolved in a solvent, is deposited on the body to be covered. The term chemisorption is in this case taken to mean that, in contrast to physisorption, a fairly strong bond exists between the head group and the surface-side atoms of the metallic surface, preferably a covalent bond.

Through the use of optimized concentrations of the substance in the solvent, self-assembled layers deposit on the metal surface in the form of a monolayer, depending on the process conditions. These thin layer systems are chemically and mechanically particularly stable and are distinguished by very low flaw density.

In the substance according to the invention, the spacer group can also be such that it reacts particularly reactively with the polymer molecules of a polymer deposited on the metal. The substance according to the invention then acts as adhesion promoter for polymers on the metallic surface.

In addition, the spacer group can also be such that it forms a bond with a spacer group of another molecule if the substance is deposited as a layer on the metal. To this end, the molecule can also have a third functional group which forms a bond with the third functional group of a further molecule. It is thereby ensured that molecules detached during the development of thermomechanical stress rapidly re-integrate into the layer combination. The good adhesion of the polymer to the metal is thus retained even after application of mechanical stresses. Crosslinking of this type between the individual molecules may already have been established before application to the surface. However, it is also possible subsequently to crosslink the molecules applied to the surface, for example by irradiation with UV light.

In accordance with the invention, one or more of the following substances are used as adhesion promoters and/or corrosion protection:

a mono-, bi- or polyfunctional sulfur compound in which in each case one molecule is articulated into at least one first head group and into at least one second head group which are connected to one another via a spacer group, in particular a thioalcohol, for example a bifunctional thioalcohol having a hydro-phobic hydrocarbon chain, in particular 11-mercaptoundecanol, a disulfide, for example a bifunctional disulfide having a hydrophobic hydrocarbon chain, in particular bis-16-hexadecanoic acid disulfide, an amino acid, a thiourea or a xanthogenate, a mono-, bi- or polyfunctional amino or nitrogen compound which can be articulated into molecules in which in each case one molecule is articulated into at least one first head group and into at least one second head group which are connected to one another via a spacer group, in particular a di-, tri- and/or tetramine, for example ethylenediamine, in particular a bifunctional ethylenediamine having a hydrophobic hydrocarbon chain such as bis(ω-hydroxyundecane)ethylenediamine, an amino acid, a thiourea, a urea, a phthalocyanine, such as a bifunctional copper phthalocyanine having a hydrophobic chain, in particular copper [29H,31H-phthalocyanine-2, 9 or 10, 16 or 17, 23 or 24-tetracarbonyl tetrachloride] which has been amidated with ω-hydroxyalkylamines, or a biuret derivative, a hydroxyl compound which can be articulated into molecules in which in each case one molecule is articulated into at least one first head group and into at least one second head group which are connected to one another via a spacer group, in particular a carbohydrate, a glycerol derivative or a pentaerythritol derivative, a carbonyl compound which can be articulated into molecules in which in each case one molecule is articulated into at least one first head group and into at least one second head group which are connected to one another via a spacer group, in particular a carboxyl, a β-diketone, an amide, an ester or a urea, such as, for example, a bifunctional urea having a hydrophobic chain part, in particular N,N'-(bis-11-hydroxyundecyl)urea.

Of the above compounds, N,N'-(bis-11-hydroxyun-decyl) urea, N,N'-(bis-11-hydroxyundecane)-ethylenediamine, copper [29H,31H-phthalocyanine-2, 9 or 10, 16 or 17, 23 or 24-tetracarbonyl tetrachloride] which has been amidated with ω-hydroxyalkylamines (synthetic procedure in accordance with H. Shirai et al., Makromol. Chemie 181, page 575 ff. (1980), amidation analogous to Houben-Weyl Volume VIII,—page 655 or Volume XI/2, p. 10 ff.), and 11-mercapto-un-decanol. With these substances, a particularly durable and long-term bonding of polymers and metals, such as copper, arises.

The following ω-hydroxyalkylamides:

Cu [29H,31H-phthalocyanine-2, 9 or 10, 16 or 17, 23 or 24-tetracarbonyl tetra(11-hydroxyundecylamide)], Cu [29H,31H-phthalocyanine-2, 9 or 10, 16 or 17, 23 or 24-tetracarbonyl tetra(3-hydroxypropylamide)], Cu [29H,31H-phthalocyanine-2, 9 or 10, 16 or 17, 23 or 24-tetracarbonyl tetra(6-hydroxyhexylamide)], can likewise be used particularly advantageously, these in each case having different chain lengths of the spacer group, namely C3, C6 or C11. Through the length of the spacer group, it is ensured that the molecule used is both sufficiently elastic and has sufficiently hydrophobic properties. Through this variation of the chain length of the spacer group, a variation of these properties can be achieved.

The invention also provides at least one further particularly advantageous substance, namely N,N'-bis(11-hydroundecane)ethylenediamine. The bifunctional ethylenediamine used for the synthesis of this substance is particularly advantageously used.

The metal-side head group of the substances according to the invention advantageously has a thio-alcohol, a disulfide, an ethylenediamine or a copper phthalocyanine, which ensures reliable bonding. For improved adhesion to silver and gold, preference is given to sulfur-containing head groups, such as thiols and disulfides.

In the process according to the invention, the substance according to the invention is provided in a $10^{-4}$ molar solution in a suitable organic solvent. The solvent for this purpose can contain acetone or ethanol. After immersion of the body in the solution for a certain period, for example 60 seconds, the body is dried in a stream of nitrogen. Before drying of the body, the body can also be rinsed in the solvent. After application of the substance to the body, the body can also be warmed, which improves the adhesion of the polymer to the metal.

The invention also relates to a plastic composite body which has a base body of a substance such as metallic material and a coating of polymer material, such as, in particular, of thermosetting material. In order to improve the adhesion, at least one of the substances according to the invention is provided in the region between the base body and the coating, in particular in a unimolecular layer.

The plastic composite body according to the invention is distinguished, in particular, by the fact that, on study of the surface of a fracture surface produced, in particular, by means of a shear experiment, in a region between the base body, in particular of metal, and a coating of polymer, such as epoxy resin, using an electron spectroscopic method, a characteristic distribution of chemical elements which indicates the presence of an essentially uni-molecular adhesion promoter layer of at least one of the substances according to the invention is evident. It is of importance here, in accordance with the invention, that multimolecular adhesion promoter layers can also give an effect according to the invention. The electron spectroscopic methods are currently carried out using ESCA (with high-energy electrons) with XPS or with AES (with X-ray quanta). The absorption or emission of characteristic radiation generated by bombardment or by irradiation is detected here. This radiation indicates the presence of certain elements, and on integration over the surface, the element composition can be determined precisely. From this composition, precise information is obtained on the type of application of the adhesion promoter molecules, since a unimolecular layer of organic molecules leaves a characteristic element distribution in the inter-face which differs significantly from the element distribution obtained if the adhesion promoting molecules are admixed with the polymer composition in the coating.

Other features that are considered as characteristic for the invention are set forth in the appended claims.

Although the invention is illustrated and described herein as embodied in an adhesion promoter for coatings on metals, a plastic composite body, a compound, a process of preparing a compound, in particular for micro-electronics, a method of using adhesion enhancing layers, and microelectronic integrated modules including adhesion enhancing layers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
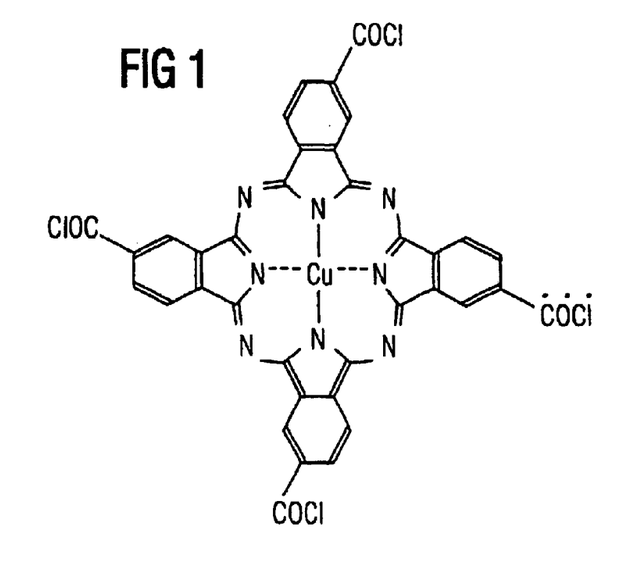
FIG. 1 shows a precursor of a substance according to the invention.

Referring now to the figures of the drawings in detail and first, particularly, to FIG. 1 thereof, there is seen a copper [29H,31H-phthalocyanine-2, 9 or 10, 16 or 17, 23 or 24-tetracarbonyl tetrachloride] molecule 1. The molecule 1 is prepared in accordance with a synthetic procedure as described by H. SHIRAI et al., makromologische Chemie 181, page 575 ff. (1980).

Figure 2:
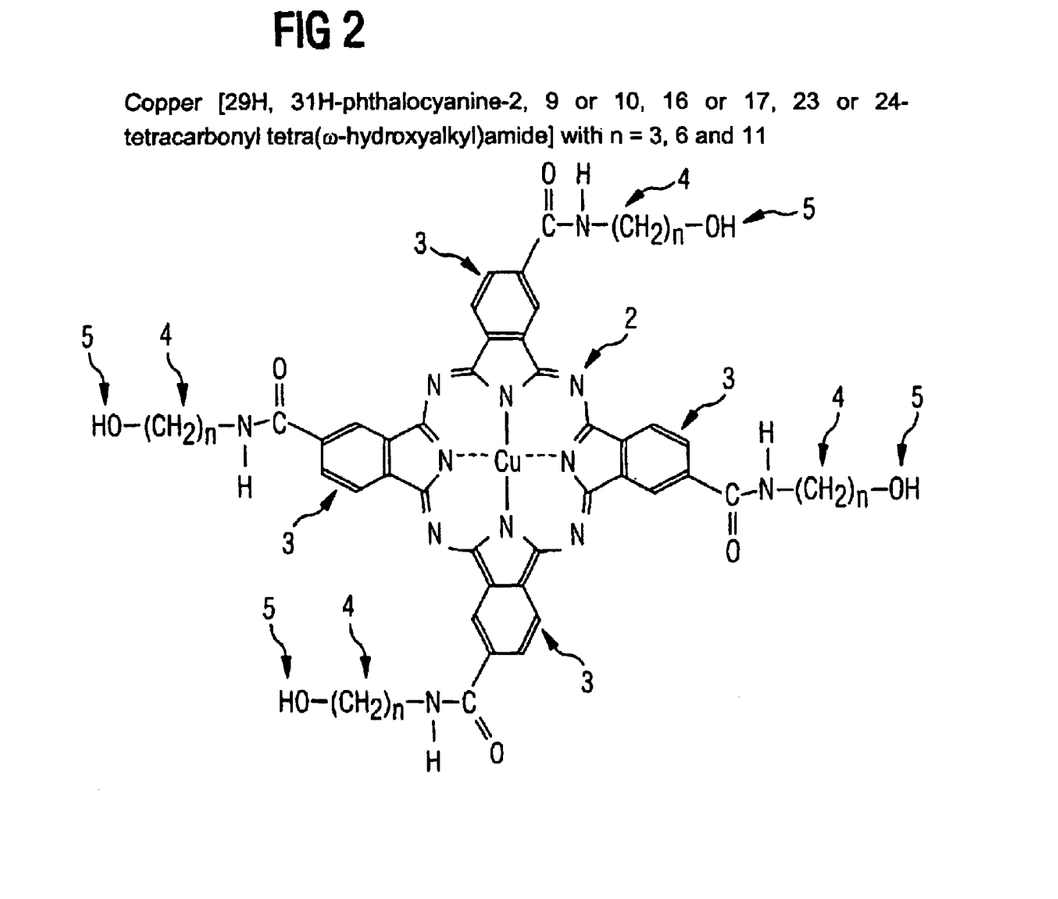
FIG. 2 shows a first substance according to the invention which is suitable for use as an adhesion promoter.

FIG. 2 shows the molecule from FIG. 1 after amidation with ω-hydroxyalkylamines.

The substance 1 according to the invention deposits on a metal surface in an essentially uni-molecular layer. An amino metal 2 formed by a complexed metal ion, preferably $Cu^{2+}$, is formed in the center of the substance 1 according to the invention. The amino metal 2 here forms a first head group which is connected via benzene rings 3 to the spacer group 4 formed by the ω-hydroxyalkylamines. OH groups provided on the spacer groups 4 form the polymer-side head group 5.

Figure 3:
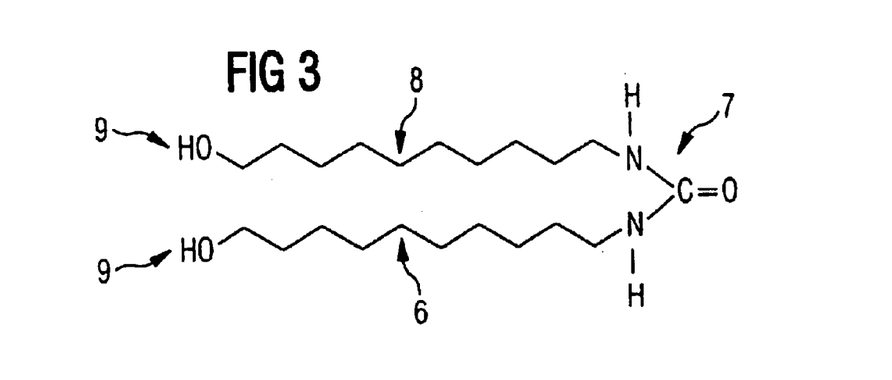
FIG. 3 shows a second substance according to the invention.

FIG. 3 shows a further substance according to the invention, an N,N'-(bis-11-hydroxyundecyl)urea.

The urea is prepared by the synthetic procedure indicated in "Canadian Journal of Chemistry 36", page 147 ff. (1958). The molecule 6 according to the inven-tion is divided into a first head group 7 formed by the urea, which deposits on metallic surfaces. The first head group 7 is connected to the two second head groups 9, each of which is formed from an OH group, via a spacer group 8 formed from two hydrocarbon chains. The OH groups 9 form covalent bonds with polymers used for the encapsulation of metals. The substance according to the invention consisting of the molecules 6 is applied to metallic bodies by immersing the body in $10^{-4}$ molar acetone solution. After remaining in this solution for 60 seconds, the body is rinsed in acetone and dried in a stream of nitrogen. The polymer is then applied to the metallic body.

Figure 4:
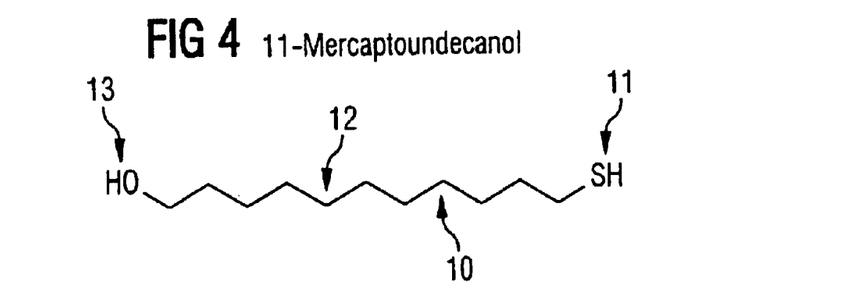
FIG. 4 shows a third substance according to the invention.

FIG. 4 shows a further substance according to the invention, namely a molecule 10 of an 11-mercapto-undecanol, which was prepared in accordance with the synthetic procedure of L. Häusling et al. in "Angewandte Chemie", 103, page 568 ff. (1991).

The molecule 10 is articulated into a first head group 11 formed by a mercaptan. The first head group 11 is connected to an OH group, which forms a second head group 13, via a spacer group 12 formed by a hydrocarbon chain.

Figure 5:
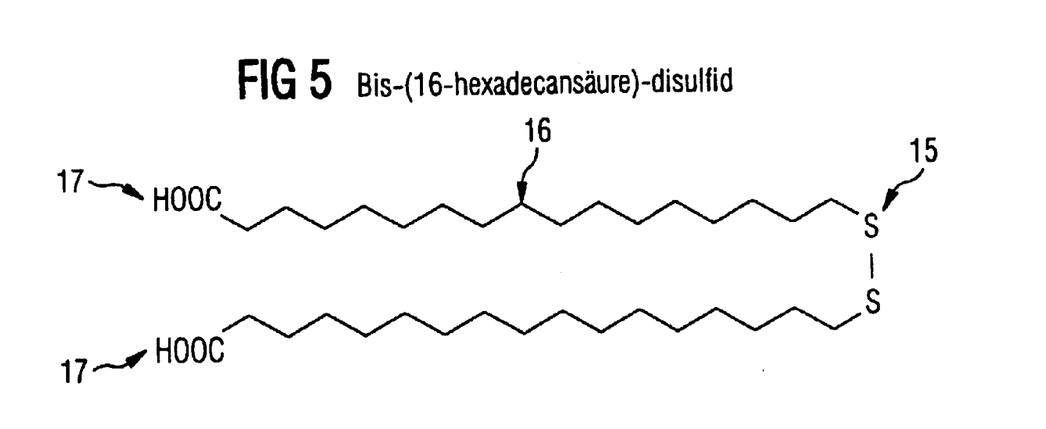
FIG. 5 shows a fourth substance according to the invention.

FIG. 5 shows a further substance according to the invention, namely a molecule 14 of a bis(16-hexadecanoic acid) disulfide.

The molecule 14 has a first head group 15 for bonding to a metal surface. The first head group 15 is connected to two second head groups 17 via a spacer group 16 formed by two hydrocarbon chains.

Figure 6:
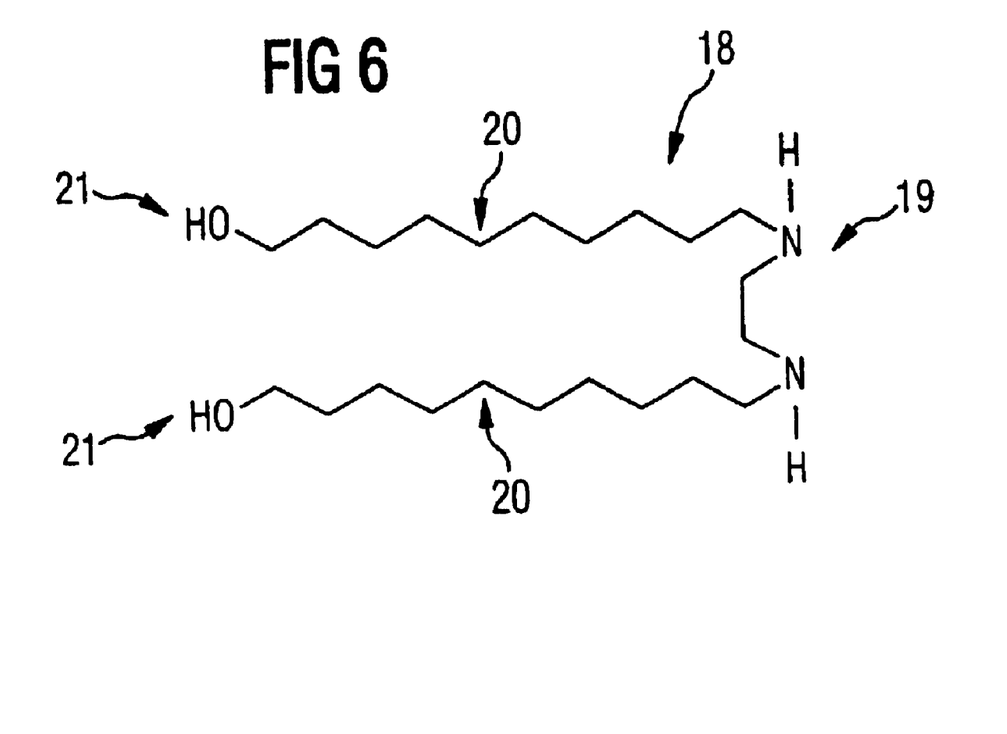
FIG. 6 shows a further substance according to the invention.

FIG. 6 shows a further substance according to the invention, namely a molecule 18 of an N,N'-bis(11-hydroundecane)ethylenediamine. The molecule 18 has a first head group 19 for bonding to a metal surface. The first head group 19 is connected to two second head groups 21 via a spacer group 20 formed by two hydrocarbon chains.

Figure 7:
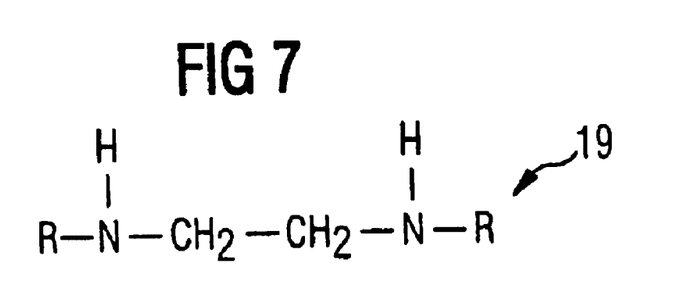
FIG. 7 shows the structure of a head group in greater detail.

FIG. 7 shows the structure of the head group 19 in greater detail. The head group 19 is formed by a bifunctional ethylenediamine.

The length of each of the spacer groups 4, 8, 12 and 16 can be matched to the requirements. In particular, it is also possible to use a spacer group which contains a further functional group which can enter a reactive connection with the same functional group of another spacer group.

For the spacer group, carbon-carbon double bonds, in particular, are suitable for this purpose.

Finally, the second head group 5, 9 or 13 can be provided by other substances, such as by at least one carboxylic acid group or an amino group.

Such derivatives can easily be produced syn-theti-cally if the basic idea of the invention has been recognized. Examples of such derived substances are given in the following list:

Thiols:

6-mercaptohexanoic acid,
6-mercaptohexanol,
11-mercaptoundecanoic acid,
11-mercaptoundecanamine,
16-mercaptohexadecanoic acid,
16-mercaptohexadecanol, Disulfides:

bis(6-hydroxyhexane) disulfide
bis(6-hexanoic acid) disulfide
bis(11-hydroxyundecane) disulfide
bis(11-undecanoic acid) disulfide
bis(6-aminoundecane) disulfide Ethylenediamines:

N,N'-bis(6-hydroxyhexane)ethylenediamine
N,N'-bis(6-hexanoic acid)ethylenediamine Phthalocyanine
copper [29H,31H-phthalocyanine-2, 9 or 10, 16 or 17, 23 or 24-tetracarbonyl tetra(6-hexanoic acid) amide

We claim:

1. A microelectronic integrated module, comprising:
   a base body made from metallic material;
   a casing made from polymeric material; and
   an adhesion enhancing layer disposed between said base body and said casing, said adhesion enhancing layer being selected from the group consisting of:
      a bifunctional thioalcohol with a hydrophobic chain portion;
      a bifunctional disulfide with a hydrophobic chain portion;
      an ethylene diamine; and
      a phthalocyanine with a hydrophobic chain portion amidated with at least one of a ω-hydroxylalkylamine and a bifunctional urea with a hydrophobic chain portion.

2. The micorelectronic integrated module according to claim 1, wherein said polymeric material of said casing is duroplastic material.

3. The microelectronic integrated module according to claim 1, wherein said bifunctional thioalcohol with a hydrophobic chain portion is 11-mercaptoundecanol.

4. The microelectronic integrated module according to claim 3, wherein said bifunctional disulfide with a hydrophobic chain portion is bis-(16-hexadecane acid-hydroxyundecane)disulfide.

5. The microelectronic integrated module according to claim 3, wherein said ethylene diamine is a bifunctional ethylene diamine with a hydrophobic chain portion.

6. The microelectronic integrated module according to claim 5, wherein said bifunctional ethylene diamine with a hydrophobic chain portion is bis-(ω-hydroxyundecane)-ethylene diamine.

7. The microelectronic integrated module according to claim 1, wherein said phthalocyanine is a bifunctional copper phthalocyanine.

8. The microelectronic integrated module according to claim 1, wherein said phthalocyanine with a hydrophobic chain portion is copper-[29H,31H-phthalocyanine-2, 9 or 10, 16 or 17, 23 or 24 tetracarbonyltetrachloride].

9. The microelectronic integrated module according to claim 1, wherein said hydrophobic chain portion is N,N-(bis-11-hydroxyundecyl)-urea.

10. A microelectronic integrated module, comprising:
    a base body made of metallic material;
    a casing made of a polymeric material;
    a substantially monomolecular layer disposed between said base body and said casing and yielding a fracture surface being superficially examinable by spectroscopy to reveal a characteristic distribution of chemical elements of at least one of the following substances:
       a bifunctional thioalcohol with a hydrophobic chain portion;
       a bifunctional disulfide with a hydrophobic chain portion;

an ethylene diamine; and a phthalocyanine with a hydrophobic chain portion that has been amidated with at least one of a ω-hydroxylalkylamine and a bifunctional urea with a hydrophobic chain portion.

11. The microelectronic integrated module according to claim 10, wherein said fracture surface of said substantially monomolecular layer yields is examinable by electron spectroscopy to reveal said characteristic distribution.

12. The microelectronic integrated module according to claim 10, wherein said fracture surface of said substantially monomolecular layer yields is examinable by x-ray spectroscopy to reveal said characteristic distribution.

13. The microelectronic integrated module according to claim 10, wherein said fracture surface is a surface created in a shear test.

14. The microelectronic integrated module according to claim 10, wherein said bifunctional thioalcohol with a hydrophobic chain portion is 11-mercaptoundecanol.

15. The microelectronic integrated module according to claim 10, wherein said bifunctional disulfide with a hydrophobic chain portion is bis-(16-hexadecane acid-hydroxyundecane)disulfide.

16. The microelectronic integrated module according to claim 10, wherein said ethylene diamine is a bifunctional ethylene diamine with a hydrophobic chain portion.

17. The microelectronic integrated module according to claim 16, wherein said bifunctional ethylene diamine with a hydrophobic portion is bis-(ω-hydroxyundecane)-ethylene diamine.

18. The microelectronic integrated module according to claim 10, wherein said phthalocyanine is bifunctional copper phthalocyanine.

19. The microelectronic integrated module according to claim 10, wherein said phthalocyanine with a hydrophobic chain portion is copper-[29H,31H-phthalocyanine-2, 9 or 10, 16 or 17, 23 or 24 tetracarbonyltetrachloride.

20. The microelectronic integrated module according to claim 10, wherein said bifunctional urea with a hydrophobic chain portion is N,N-(bis-11-hydroxyundecyl)-urea.

* * * * *